United States Patent
Ooishi et al.

(10) Patent No.: US 9,426,879 B2
(45) Date of Patent: Aug. 23, 2016

(54) REINFORCED METAL CORE BOARD AND ELECTRIC CONNECTION BOX HAVING THE SAME

(75) Inventors: Manabu Ooishi, Shizuoka (JP); Maki Sugiura, Shizuoka (JP); Kazuhiro Yamamoto, Shizuoka (JP); Kenji Ogawa, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 180 days.

(21) Appl. No.: 13/879,864

(22) PCT Filed: Oct. 20, 2011

(86) PCT No.: PCT/JP2011/074738
§ 371 (c)(1),
(2), (4) Date: Apr. 17, 2013

(87) PCT Pub. No.: WO2012/053663
PCT Pub. Date: Apr. 26, 2012

(65) Prior Publication Data
US 2013/0206444 A1    Aug. 15, 2013

(30) Foreign Application Priority Data
Oct. 20, 2010   (JP) .................................. 2010-235153

(51) Int. Cl.
H05K 1/02    (2006.01)
H05K 3/46    (2006.01)
H02G 3/08    (2006.01)

(52) U.S. Cl.
CPC .................. *H05K 1/02* (2013.01); *H02G 3/086* (2013.01); *H05K 3/4641* (2013.01); *H05K 1/0203* (2013.01); *H05K 2201/09663* (2013.01)

(58) Field of Classification Search
CPC .................................................... H05K 3/4641

USPC ........................... 174/250, 255; 361/622, 795
See application file for complete search history.

(56) References Cited

U.S. PATENT DOCUMENTS 4,208,080 A * 6/1980 Teagno ................ H01R 12/523
29/830
5,410,107 A * 4/1995 Schaper ........................ 174/255
(Continued)

FOREIGN PATENT DOCUMENTS

| CN | 101124858 A | 2/2008 |
|---|---|---|
| DE | 20 2005 019 094 U1 | 5/2006 |

(Continued)

OTHER PUBLICATIONS

ISA 210 and 237 for PCT/JP2011/074738 dated Jun. 18, 2012.
(Continued)

*Primary Examiner* — Courtney Smith
*Assistant Examiner* — Jessey R Ervin
(74) *Attorney, Agent, or Firm* — Kenealy Vaidya LLP

(57) ABSTRACT

For providing an electric connection box including a metal core board, which can limit increase of a size thereof and be prevented from bending along the slit, the electric connection box 10 includes a metal core board 1, in which a plurality of core metal plates 21, 22 is laminated and insulation resin is filled between each of the plurality of core metal plates 21, 22. The plurality of core metal plates 21, 22 are provide with slits 3A, 3B to divide the core metal plates 21, 22 to a plurality of separate plates 21a, 21b, 22a, 22b and be filled with insulation resin. The slits 3A, 3B is formed not to overlap each other on the same one line when viewing in a vertical direction about the metal core board 1. The electric connection box 10 distributes electric power inputted from a plurality of power systems to each separate plates 21a, 21b, 22a, 22b.

7 Claims, 14 Drawing Sheets

(56) References Cited

U.S. PATENT DOCUMENTS

| | | | | |
|---|---|---|---|---|
| 5,510,758 | A * | 4/1996 | Fujita et al. | 333/247 |
| 7,428,155 | B2 * | 9/2008 | Nakao | 361/794 |
| 2005/0098346 | A1 * | 5/2005 | Fan et al. | 174/260 |
| 2005/0178583 | A1 * | 8/2005 | Lee | 174/255 |
| 2005/0257957 | A1 * | 11/2005 | Vasoya | H05K 3/445 174/260 |
| 2007/0279842 | A1 | 12/2007 | Ishida et al. | |
| 2009/0173520 | A1 * | 7/2009 | Duong | H05K 1/0216 174/250 |
| 2011/0088928 | A1 * | 4/2011 | Lim | H05K 1/0262 174/252 |
| 2011/0139489 | A1 * | 6/2011 | Yoon et al. | 174/250 |

FOREIGN PATENT DOCUMENTS

| | | |
|---|---|---|
| DE | 20 2005 019 094 U1 | 6/2006 |
| EP | 2 224 798 A1 | 9/2010 |
| JP | 53-24592 | 3/1978 |
| JP | 2007-128929 A | 5/2007 |
| JP | 2007-325345 A | 12/2007 |
| WO | 2005/117508 A2 | 12/2005 |

OTHER PUBLICATIONS

Japanese Office Action for the related Japanese Patent Application No. 2010-235153 dated Jul. 22, 2014.

Chinese Office Action for the related Chinese Patent Application No. 201180051042.2 dated Apr. 1, 2015.

* cited by examiner

REINFORCED METAL CORE BOARD AND ELECTRIC CONNECTION BOX HAVING THE SAME

This application is a U.S. national phase filing under 35 U.S.C. §371 of PCT Application No. PCT/JP2011/074738, filed Oct. 20, 2011, and which in turn claims priority under 35 U.S.C. §119 to Japanese Patent Application No. JP2010-235153, filed Oct. 20, 2010, the entireties of which are incorporated by reference herein.

TECHNICAL FIELD

This invention relates to a metal core board to be used in an electric connection box and an electric connection box distributing electric power by using the metal core board.

BACKGROUND ART

Many various electronic apparatuses are provided in a car. For distributing electric power from an electric power source to the various electronic apparatuses, an electric connection box is arranged in the car. The electric connection box, which is configured to have one of various structures, is applied for that and for example, the electric connection shown in Patent Document 1 is configured to distribute by using a metal core board.

As shown in FIG. 25, the electric connection box 510, which applies a core metal plate 502 of a metal core board 501 for not only dissipating heat but also performing as a part of an electric power distributing circuit, is well-known. The electric connection box 510 distributing electric power from a battery and an alternator to electronic apparatuses includes the metal core board 501, a plurality of electronic components mounted on a surface of the metal core board 501, a connector 507a connected to the battery, a connector 507b connected to the alternator and a not-shown case receiving the above.

The metal core board 501 is provided with the core metal plate 502, insulation layers 504a, 504b covering the core metal plate 502 and conductive circuits 505 arranged at each of surfaces of the insulation layers 504a, 405b. The conductive circuit 505 is made of copper foil.

The above-mentioned connector 507a includes an L-shaped terminal 571a and a connector housing 570a. The terminal 571a includes a first connecting portion 572a to be connected with a connector of a wiring harness connected to the battery and a second connecting portion 573a mounted at the metal core board 501. The first connecting portion 572a is arranged inside the connector housing 570a. The second connecting portion 573a is joined to the metal core circuit board 501 so as to pass through the metal core board 501 and be connected electrically to the conductive circuit 505 and be insulated from the core metal plate 502.

The above-mentioned connector 507b includes an L-shaped terminal 571b and a connector housing 570b. The terminal 571b includes a first connecting portion 572b to be connected with a connector of a wiring harness connected to the alternator and a second connecting portion 573b mounted at the metal core board 501. The first connecting portion 572b is arranged inside the connector housing 570b. The second connecting portion 573b is joined to the metal core circuit board 501 so as to pass through the metal core board 501 and be connected electrically to the conductive circuit 505 and the core metal plate 502.

As mentioned above, in the electric connection box 510, the electric power distributing circuit for distributing the electric power from the battery is structured by only the conductive circuit 505 arranged at each of the surfaces of the insulation layers 504a, 504b, and a power distributing circuit for distributing the electric power from the alternator is structured by the conductive circuit 505 and the core metal plate 502. According to such power distributing circuit for distributing the electric power from the battery, thickness of the conductive circuit 505 is thinner than thickness of the core metal plate 502, so that correspondingly, larger surface area is required, and thereby it is problem that the metal core circuit board 510 becomes larger.

As a solution for the problem, according to an electric connection box 610 as shown in FIG. 26, a line-shaped slit 603 is formed at a core metal plate 602 of a metal core board 601 so as to divide the core metal plate 602 to two separate plates 602a, 602b, and one of the separate plates 602a is used for distributing electric power from the battery, and the other one of the separate plates 602b is used for distributing electric power from the alternator. Thereby, increasing a size of the metal core board 601 may be limited.

In FIG. 26, insulation layers 604a, 604b, which fill the slit 603 and cover the surface of the core metal plate 602 so as to form the two divided core metal plates 602 integrally, are shown. In FIG. 26, the conductive circuit 605 arranged at each of the surfaces of the insulating layers 604a, 604b are shown. In FIG. 26, the connector 570a connected to the battery is shown as same as FIG. 25. In FIG. 26, the connector 570b connected to the alternator is shown as same as FIG. 25.

CITATION LIST

Patent Document

Patent Document 1: Japan Patent Application Published No. 2007-325345

SUMMARY OF INVENTION

Objects to be solved

According to the electric connection box 610, in which the core metal plate 602 is only divided simply to two portions by forming the line-shaped slit 603 as shown in FIG. 26, weight of electronic components mounted at the metal core board 601 and weight of the metal core board 601 itself act at the slit 603, which strength is less than other portion. Thereby, the metal core board 601 may bent as shown in FIG. 27.

According to the above problems, an object of the present invention is to provide a metal core board, which can limit increase of the size thereof and be prevented from bending along the slit, can be provided.

How to attain the object of the present invention

According to the electric connection box 610, in which the core metal plate 602 is only divided simply to two portions by forming the line-shaped slit 603 as shown in FIG. 26, weight of electronic components mounted at the metal core board 601 and weight of the metal core board 601 itself act at the slit 603, which strength is less than other portions. Thereby, the metal core board 601 may bend as shown in FIG. 27.

An invention according to claim 2 is specified in the present invention described in claim 1 in that the slit is formed at all of the plurality of core metal plates.

An invention according to claim 3 is specified in the present invention described in claim 1 in that the slit is formed at the plurality of core metal plates other than at least one of the plurality of core metal plates.

An invention according to claim 4 is specified in an electric connection box in that the electric connection box includes the metal core board according to claim 1, 2 or 3, and distributes electric power inputted from a plurality of power source systems respectively to each of the core metal plates and each of the separate plates.

Effects Of The Invention

According to the present invention, at least one of the plurality of core metal plates is divided to plurality of separate plates so as to form a slit filled with the insulation resin, so that the each of the core metal plates or the each of the separate plates can be used as an electric power distributing circuit for electric power from a plurality of power sources. Also, the slit overlapped on the same one line when viewing in a vertical direction about the metal core board is formed partially so as to eliminate a slit overlapping over whole length of the core metal plate, so that each of slits is overlapped by the part of the core metal plate, which has no slit, and a part which is weakened by forming a slit can be enforced. Therefore, the metal core board, which enlarging the size thereof can be limited and bending along the slit can be prevented, is provided.

According to the invention described in claim 2, the slit is arranged at all core metal plates, so that each of the separate plates can be applied as the electric power distributing circuit distributing electric power from the plurality of power source systems. Thereby, increasing the size of the metal core board can be limited. The metal core board which can limit increase of the size thereof and be prevented from bending along the slit, can be provided.

According to the invention described in claim 3, the slit is not formed at the at least one of the plurality of core metal plates. Thereby, the core metal plate having no slit overlaps the slit of the other core metal plates, so that a part of the core metal plate weakened by the slit can be enforced. Therefore, the metal core board which can limit increase of the size thereof and be prevented from bending along the slit, can be provided.

According to the present invention claimed in claim 4, the electric connection box includes the metal core board described in any one of claims 1-3, so that the electric connection box having the metal core board, which can limit increase of the size thereof and be prevented from bending along the slit, can be provided.

DESCRIPTION OF EMBODIMENTS

First embodiment: A metal core board and an electric connection box as a first embodiment according to the present invention are described with reference to drawings FIGS. 1-6.

Figure 1:
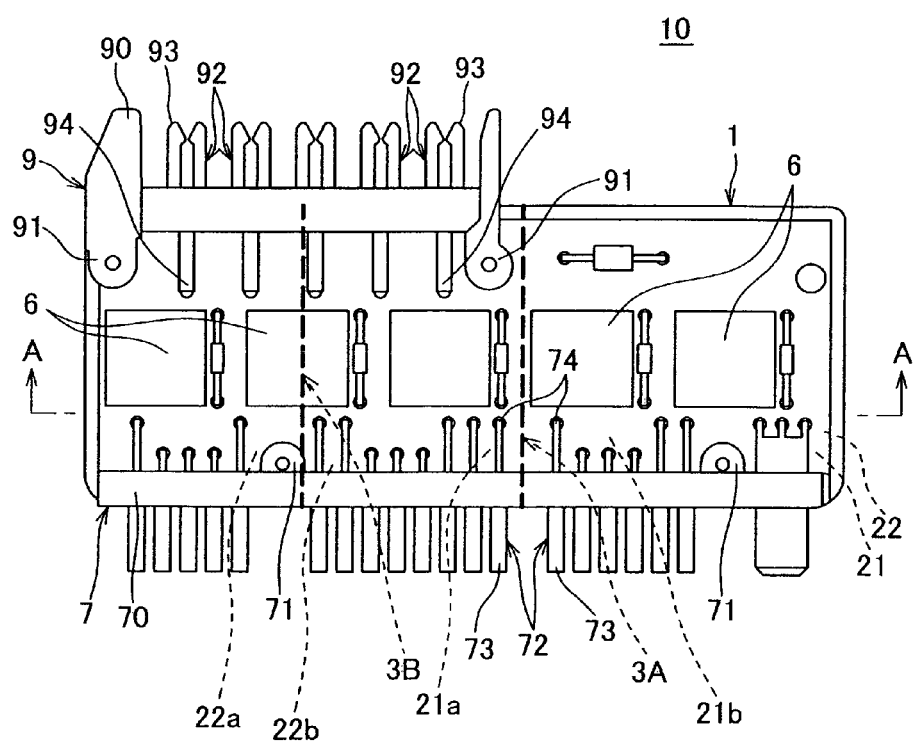
FIG. 1 is a plan view showing outline structures of a metal core board and an electric connection box of the first embodiment according to the present invention.
Figure 2:
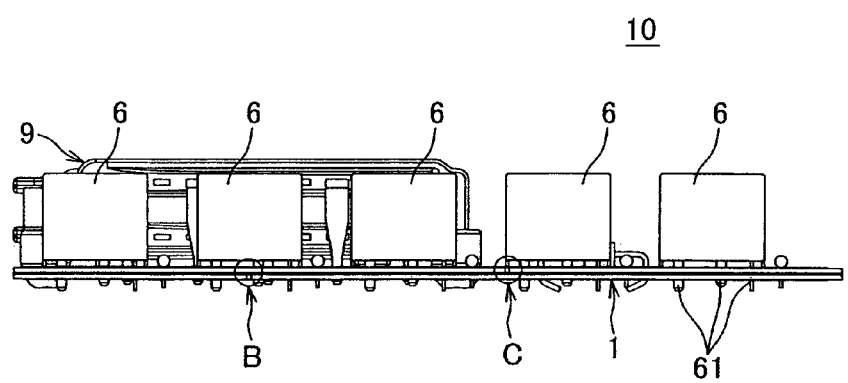
FIG. 2 is a cross-sectional view taken along line A-A shown in FIG. 1.

The electric connection box 10 according to the embodiment is mounted at a car and configured to distribute electric power from a plurality of power source systems including a battery and an alternator to a plurality of electronic apparatuses. The electric connection box 10 as shown in FIGS. 1 and 2 includes a metal core board 1; a plurality of relays 6, a connector block 7 and a fuse block 9, which are mounted on a surface of the metal core board 1; and a not-shown case.

Figure 3:
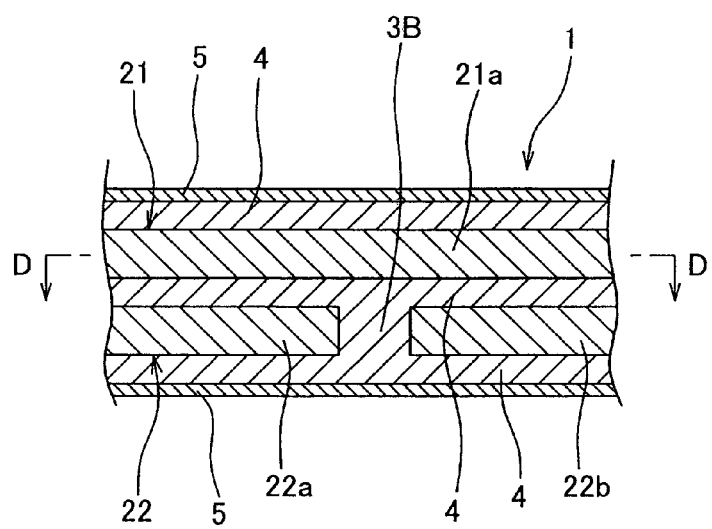
FIG. 3 is an expanded view of a B area shown in FIG. 2.
Figure 4:
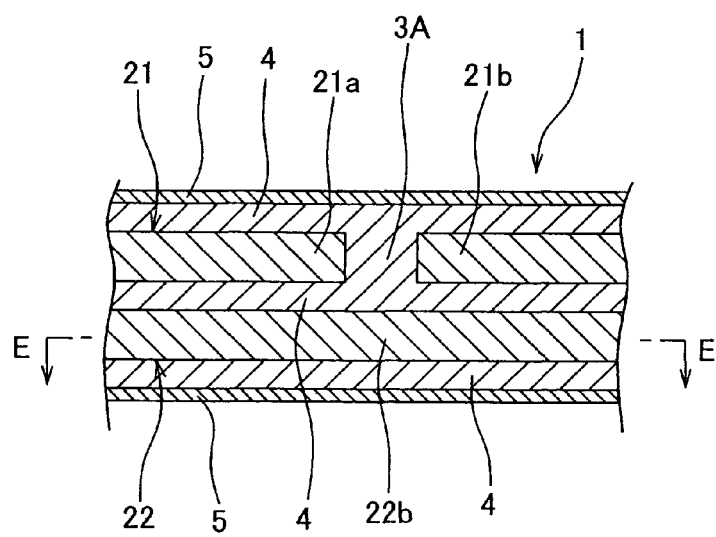
FIG. 4 is an expanded view of a C area shown in FIG. 2.

The metal core board 1 as shown in FIGS. 3 and 4 is provided with two layered core metal plates 21, 22 arranged at an interval to each other; three layered insulation layers 4 arranged between the core metal plates 21, 22, and at a surface of the core metal plate 21 at a side far from the core metal plate 22, and at a surface of the core metal plate 22 at a side far from the core metal plate 21; a conductive print circuit layer 5 formed by cupper foil arranged at a surface of the insulation layer which is non-contact with the core metal plates 21, 22; and a plurality of not-shown through holes. The metal core board 1 is formed into a rectangular shape. Thus, the metal core board 1 is configured to laminate the two core metal plates 21, 22 to be two layers and laminate the insulation layer 4 as insulation resin between the core metal plates 21, 22.

Figure 5:
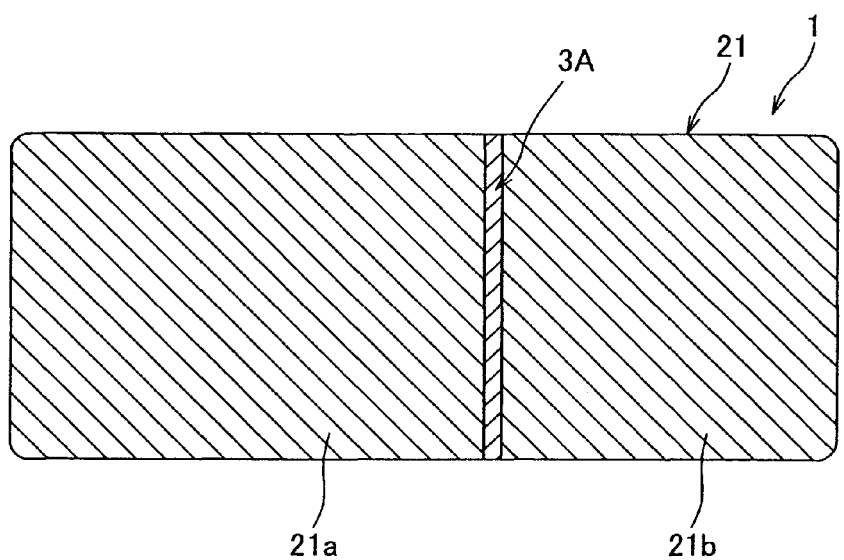
FIG. 5 is a cross-sectional view taken along line D-D shown in FIG. 3.
Figure 6:
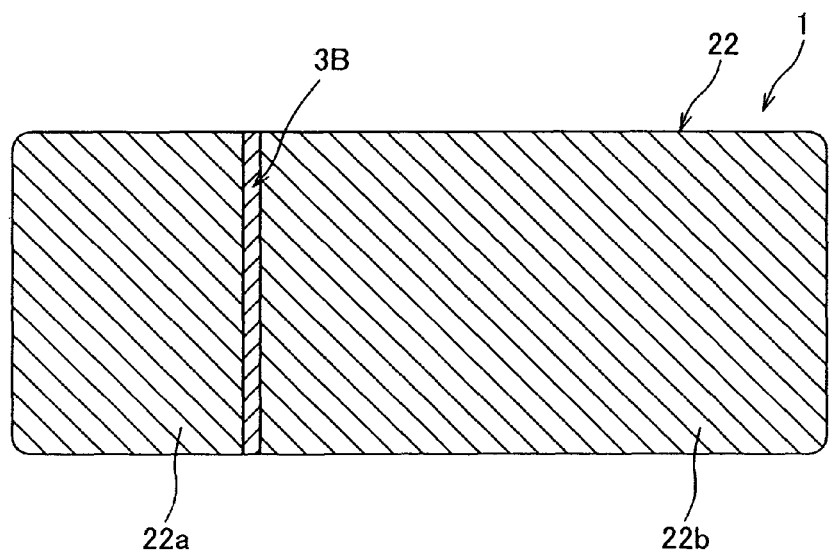
FIG. 6 is a cross-sectional view taken along line E-E shown in FIG. 4.

The core metal plate 21, 22 is formed with a rectangular cupper plate or a rectangular metal plate including cupper. At the core metal plates 21, 22, as shown in FIGS. 5 and 6, straight slits 3A, 3B are formed so as to divide the core metal plates 21, 22 to each two separated plates 21a, 21b and 22a, 22b. The slit 3A, 3B is formed to have a width of 0.5-1.0 mm. Insulation material structuring the insulation layer 4 is filled in the slits 3A, 3B. Thereby, the separated plate 21a and the separated plate 21b of the core metal plate 21 are insulated from each other and also formed integrally with the insulation material. Similarly, the separated plate 22a and the separated plate 22b of the core metal plate 22 are insulated from each other and also formed integrally with the insulation material. In FIGS. 5 and 6, through holes are not shown.

The insulation layer 4 is composed of prepreg which is made by impregnating epoxy resin into glass fiber fabrics. In other words, the above slits 3A, 3B are fixed by the epoxy resin. The three-layered insulation layers 4 adhere and integrate the two core metal plates 21, 22.

The relay 6 includes a plurality of terminals 61 inserted into each through hole of the metal core board 1 and soldered with them, as shown in FIG. 2.

The connector block 7 includes a housing 70 made of synthetic resin and a plurality of L-shaped terminals 72 supported by the housing 70 as shown in FIG. 1. The housing 70 is provided with a pair of screw fixing portions 71 to be fixed by screws to the metal core plate 1. The terminal 72 includes a first connecting portion 73 to be connected with a mating connector and a second connecting portion 74 inserted into the through hole of the metal core board 1 and soldered therewith. The connector block 7 is connected with a connector of a wiring harness which is connected with the battery, a connector of a wiring harness which is connected with the alternator and a connector of the other wiring harness.

The fuse block 9 includes a housing 90 made of synthetic resin and a plurality of L-shaped terminals 92 supported by the housing 90. The housing 90 is provided with a pair of screw fixing portions 91 to be fixed by screws to the metal core plate 1. The terminal 92 includes a first connecting portion 93 to be connected with a fuse and a second connecting portion 94 inserted into the through hole of the metal core board 1 and soldered therewith.

Such electric connection box 10 distributes electric power from the plurality of power source systems including the battery and the alternator through the wiring harnesses and the connector block 7 to the conductive print circuit layer 5, the relay 6 and the fuse block 9, and toward each of the electronic apparatuses.

According to the present invention, the core metal plates 21, 22, that is the separate plates 21a, 21b and 22a, 22b, can be used not only for heat dissipation, but also as a part of an electric power distributing circuit, so that increase of the metal core board 1 can be limited.

In the electric connection box 10 according to the present invention, for preventing that the metal core board 1 is bent along the slit 3A and 3B by loading weights of the relay 6, the connector block 7 and the fuse block 9 and a weight of the metal core board 1 itself at the slits 3A and 3B having strength weaker than the other portions, reinforce structures described hereafter are applied.

As a first one of the reinforce structures according to the present invention, the slits 3A and 3B are arranged so as to be not on the same line when viewed in a direction vertical to the metal core board 1 as shown in FIG. 1. According to the reinforce structure, the slit 3A overlaps a part of the core metal plate 22, which the slit 3B is not arranged, that is the separate plate 22b, and the slit 3B overlaps a part of the core metal plate 21, which the slit 3A is not arranged, that is the separate plate 21a, so that parts, which have weaker strength by arranging the slits 3A and 3B, can be reinforced.

As a second one of the reinforce structures according to the present invention, one of the relays 6 is arranged to bridge over the slit 3B, and at least one of a plurality of terminals 61 of the one of the relays 6 is soldered with the separate plate 22a, and remains of the plurality of terminals 61 are soldered with the separate plate 22b, as show in FIG. 1.

As a third one of the reinforce structures according to the present invention, the connector block 7 is arranged to bridge over the slits 3A and 3B, one of the pair of screw fixing portions 71 of the connector block 7 is fixed by screw to the separate plate 21a and the separate plate 22a, and the other one of the pair of screw fixing portions 71 is fixed by screw to the separate plate 21b and the separate plate 22 as shown in FIG. 1. Furthermore, some terminals 72 of the connector block 7 are soldered with the separate plate 21a and the separate plate 22a, and remains of the terminals 72 of the connector block 7 are soldered with the separate plate 21b and the separate plate 22b.

As a fourth one of the reinforce structures according to the present invention, the fuse block 9 is arranged to bridge over the slit 3B, and one of a pair of screw fixing portions 91 of the fuse block 9 is fixed by screw to the separate plate 21a and the separate plate 22a, and the other one of the pair of screw fixing portions 91 is fixed by screw to the separate plate 21a and the separate plate 22b. Furthermore, some terminals 92 of the fuse block 9 are soldered with the separate plate 21a and the separate plate 22a, and remains of the terminals 92 of the fuse block 9 are soldered with the separate plate 21a and the separate plate 22b.

According to the present invention, the metal core board 1, which can limit increase of size thereof and can prevent from bending along the slits 3A, 3B, and the electric connection box 10 including the metal core board 1 can be provided.

The second embodiment: the metal core board and the electric connection according to the second embodiment of the present invention will be described with reference to drawings FIGS. 7-10. The same components as the above-mentioned first embodiment are given the same mark and the description about it is omitted.

Figure 7:
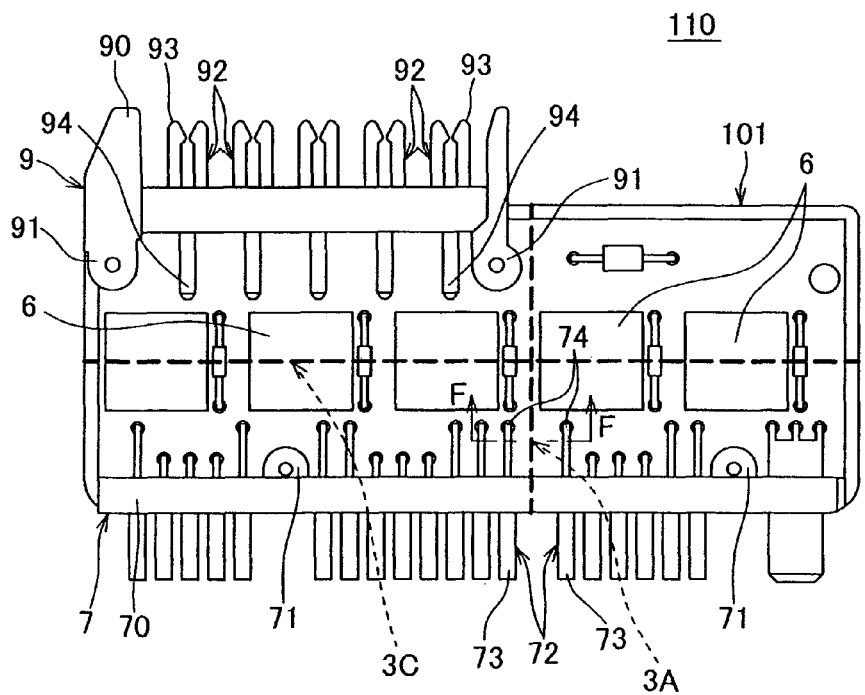
FIG. 7 is a plan view showing outline structures of a metal core board and an electric connection box of the second embodiment according to the present invention.

The electric connection box 110 according to the embodiment is mounted at a car and configured to distribute electric power from the plurality of power source systems including the battery and the alternator to the plurality of electronic apparatuses. The electric connection box 110 as shown in FIG. 7 includes a metal core board 101; the plurality of relays 6, the connector block 7 and the fuse block 9, which are mounted on a surface of the metal core board 101; and a not-shown case.

Figure 8:
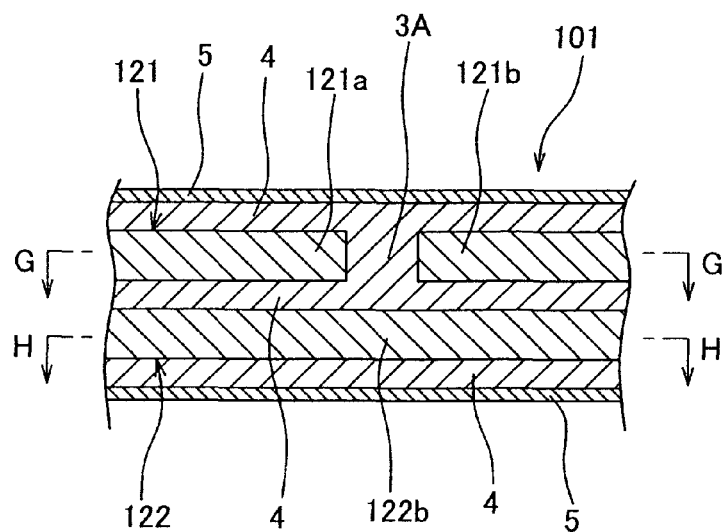
FIG. 8 is a cross-sectional view taken along line F-F shown in FIG. 7.

The metal core board 101 as shown in FIG. 8 is provided with two layered core metal plates 121, 122 arranged at an interval to each other; three layered insulation layers 4 arranged between the core metal plates 121, 122, and at a surface of the core metal plate 121 at a side far from the core metal plate 122, and at a surface of the core metal plate 122 at a side far from the core metal plate 121; a conductive print circuit layer 5 formed by copper foil arranged at a surface of the insulation layer which is non-contact with the core metal plates 121, 122; and a plurality of not-shown through holes. The metal core board 1 is formed into a rectangular shape.

Figure 9:
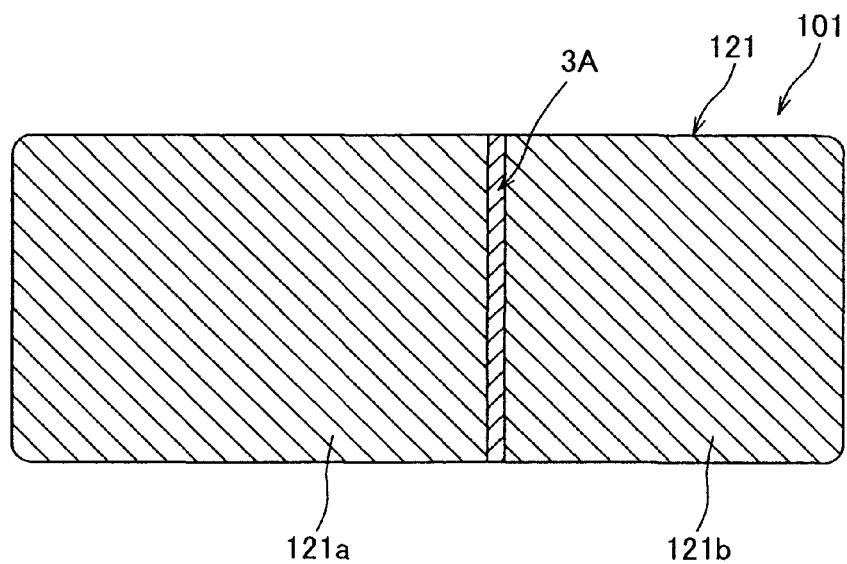
FIG. 9 is a cross-sectional view taken along line G-G shown in FIG. 8.
Figure 10:
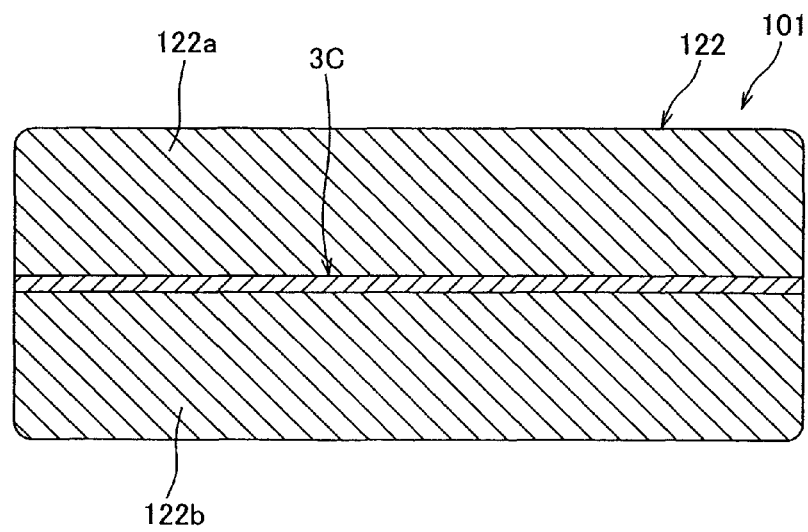
FIG. 10 is a cross-sectional view taken along line H-H shown in FIG. 8.

The core metal plate 121, 122 is formed with a rectangular copper plate or a rectangular metal plate including copper. At the core metal plates 121, 122, as shown in FIGS. 9 and 10, the straight slits 3A, 3C are formed so as to divide the core metal plates 121, 122 to each two separated plates 121a, 121b and 122*a*, 122*b*. The slit 3A, 3C is formed to have a width of 0.5-1.0 mm. Insulation material structuring the insulation layer 4 is filled in the slits 3A, 3C. Thereby, the separated plate 121*a* and the separated plate 121*b* of the core metal plate 121 are insulated from each other and also formed integrally with the insulation material. Similarly, the separated plate 122*a* and the separated plate 122*b* of the core metal plate 122 are insulated from each other and also formed integrally with the insulation material. In FIGS. 9 and 10, through holes are not shown.

Such electric connection box 110 distributes electric power inputted from the plurality of power source systems including the battery and the alternator to each of separate plates 121*a*, 121*b*, 122*a* and 122*b* toward each of the electronic apparatuses.

In the electric connection box 110 according to the present invention, for preventing that the metal core board 101 is bent along the slit 3A and 3C by loading weights of the relay 6, the connector block 7 and the fuse block 9 and a weight of the metal core board 101 itself at the slits 3A and 3C having strength weaker than the other portions, reinforce structures described hereafter are applied.

As the reinforce structures according to the present invention, the slits 3A and 3C are arranged so as to intersect each other when viewed in the direction vertical to the metal core board 101 as shown in FIG. 7. In other word, the slits 3A and 3C are arranged so as to be not on the same line when viewed in a direction vertical to the metal core board 101. According to the reinforce structure, the slit 3A overlaps a part of the core metal plate 122, which the slit 3C is not arranged, and the slit 38 overlaps a part of the core metal plate 121, which the slit 3A is not arranged, so that parts, which have weaker strength by arranging the slits 3A and 3C, can be reinforced.

According to the present invention, the metal core board 101, which can limit increase of size thereof and can prevent from bending along the slits 3A, 3C, and the electric connection box 110 including the metal core board 101 can be provided.

The third embodiment: the metal core board and the electric connection according to the second embodiment of the present invention will be described with reference to drawings FIGS. 11-14. The same components as the above-mentioned first embodiment are given the same mark and the description about it is omitted.

Figure 11:
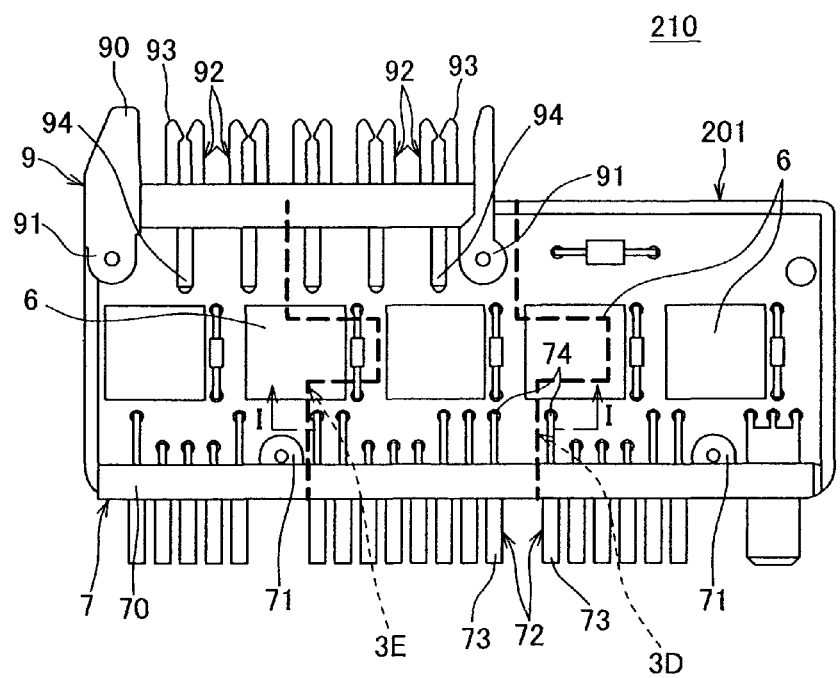
FIG. 11 is a plan view showing outline structures of a metal core board and an electric connection box of the third embodiment according to the present invention.

The electric connection box 210 according to the embodiment is mounted at a car and configured to distribute electric power from a plurality of power source systems including a battery and an alternator to a plurality of electronic apparatuses. The electric connection box 210 as shown in FIG. 11 includes a metal core board 201; a plurality of relays 6, a connector block 7 and a fuse block 9, which are mounted on a surface of the metal core board 201; and a not-shown case.

Figure 12:
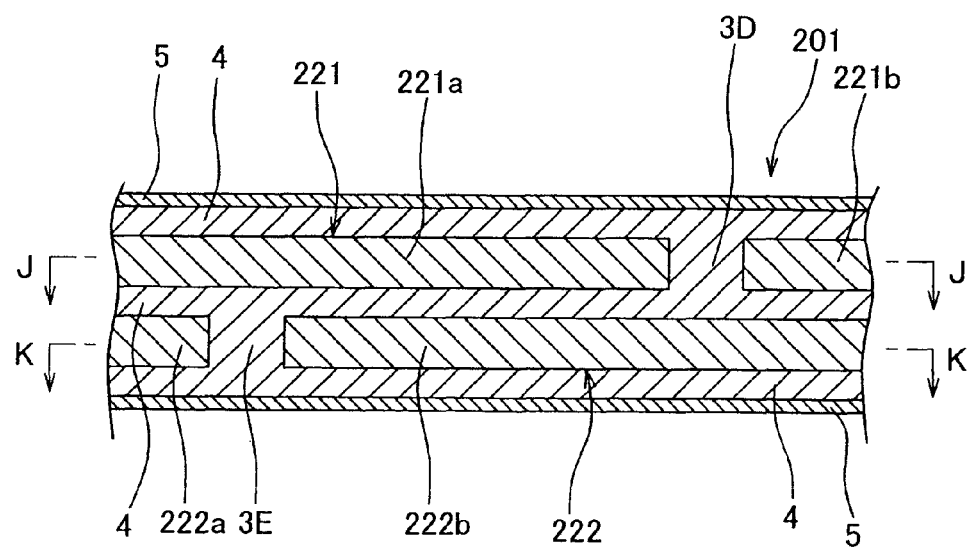
FIG. 12 is a cross-sectional view taken along line I-I shown in FIG. 11.

The metal core board 201 as shown in FIG. 12 is provided with two layered core metal plates 221, 222 arranged at an interval to each other; three layered insulation layers 4 arranged between the core metal plates 221, 222, and at a surface of the core metal plate 221 at a side far from the core metal plate 222, and at a surface of the core metal plate 222 at a side far from the core metal plate 221; a conductive print circuit layer 5 formed by copper foil arranged at a surface of the insulation layer which is non-contact with the core metal plates 221, 222; and a plurality of not-shown through holes. The metal core board 201 is formed into a rectangular shape.

Figure 13:
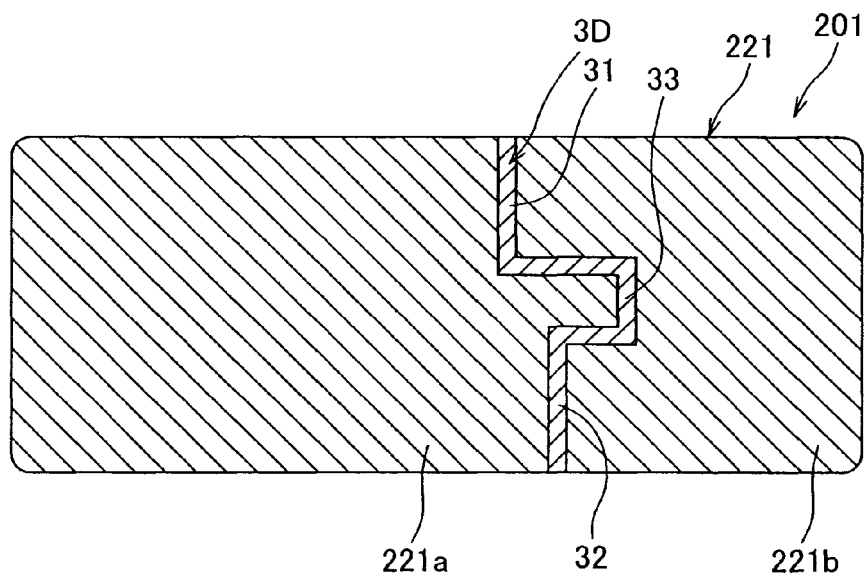
FIG. 13 is a cross-sectional view taken along line J-J shown in FIG. 12.
Figure 14:
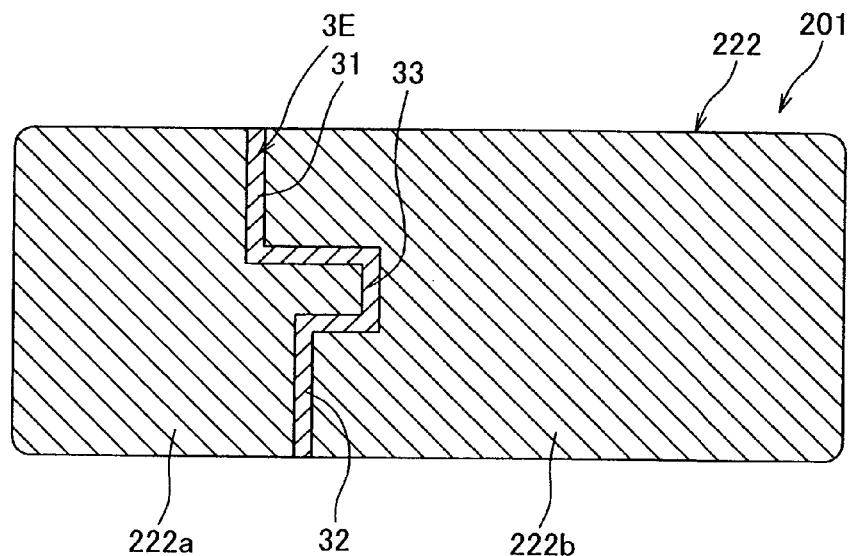
FIG. 14 is a cross-sectional view taken along line K-K shown in FIG. 12.

The core metal plate 221, 222 is formed with a rectangular copper plate or a rectangular metal plate including copper. At the core metal plates 221, 222, as shown in FIGS. 13 and 14, straight slits 3D, 3E are formed so as to divide the core metal plates 221, 222 to each two separated plates 221*a*, 221*b* and 222*a*, 222*b*. The slit 3D, 3E is formed to have a width of 0.5-1.0 mm. Insulation material structuring the insulation layer 4 is filled in the slits 3D, 3E. Thereby, the separated plate 221*a* and the separated plate 221*b* of the core metal plate 221 are insulated from each other and also formed integrally with the insulation material. Similarly, the separated plate 222*a* and the separated plate 222*b* of the core metal plate 222 are insulated from each other and also formed integrally with the insulation material. In FIGS. 13 and 14, through holes are not shown.

Such electric connection box 210 distributes electric power inputted from the plurality of power source systems including the battery and the alternator to each separate plates 221*a*, 221*b*, 222*a*, 222*b* toward each of the electronic apparatuses.

In the electric connection box 210 according to the present invention, for preventing that the metal core board 201 is bent along the slit 3D and 3E by loading weights of the relay 6, the connector block 7 and the fuse block 9 and a weight of the metal core board 201 itself at the slits 3D and 3E having strength weaker than the other portions, reinforce structures described hereafter are applied.

As a first one of the reinforce structures according to the present invention, the slits 3D and 3E are arranged so as to be not on the same line when viewed in a direction vertical to the metal core board 201 as shown in FIG. 11. According to the reinforce structure, the slit 3D overlaps a part of the core metal plate 222, which the slit 3D is not arranged, that is the separate plate 222*b*, and the slit 3E overlaps a part of the core metal plate 221, which the slit 3D is not arranged, that is the separate plate 221*a*, so that parts, which have weaker strength by arranging the slits 3D and 3E, can be reinforced.

The metal core board 1 as shown in FIGS. 3 and 4 is provided with two layered core metal plates 21, 22 arranged at an interval to each other; three layered insulation layers 4 arranged between the core metal plates 21, 22, and at a surface of the core metal plate 21 at a side far from the core metal plate 22, and at a surface of the core metal plate 22 at a side far from the core metal plate 21; a conductive print circuit layer 5 formed by copper foil arranged at a surface of the insulation layer 4 which is non-contact with the core metal plates 21, 22; and a plurality of not-shown through holes. The metal core board 1 is formed into a rectangular shape. Thus, the metal core board 1 is configured to laminate the two core metal plates 21, 22 to be two layers and laminate the insulation layer 4 as insulation resin between the core metal plates 21, 22.

The core metal plate 21, 22 is formed with a rectangular copper plate or a rectangular metal plate including copper. At the core metal plates 21, 22, as shown in FIGS. 5 and 6, straight slits 3A, 3B are formed so as to divide the core metal plates 21, 22 to each two separated plates 21*a*, 21*b* and 22*a*, 22*b*. The slit 3A, 3B is formed to have a width of 0.5-1.0 mm. Insulation material structuring the insulation layer 4 is filled in the slits 3A, 3B. Thereby, the separated plate 21a and the separated plate 21*b* of the core metal plate 21 are insulated from each other and also formed integrally with the insulation material. Similarly, the separated plate 22*a* and the separated plate 22*b* of the core metal plate 22 are insulated from each other and also formed integrally with the insulation material. In FIGS. 5 and 6, through holes are not shown.

According to the present invention, the metal core board 201, which can limit increase of size thereof and can prevent from bending along the slits 3D, 3E, and the electric connection box 210 including the metal core board 201 can be provided.

The fourth embodiment: the metal core board and the electric connection according to the second embodiment of the present invention will be described with reference to drawings FIGS. 15-19. The same components as the above-mentioned first embodiment are given the same mark and the description about it is omitted.

Figure 15:
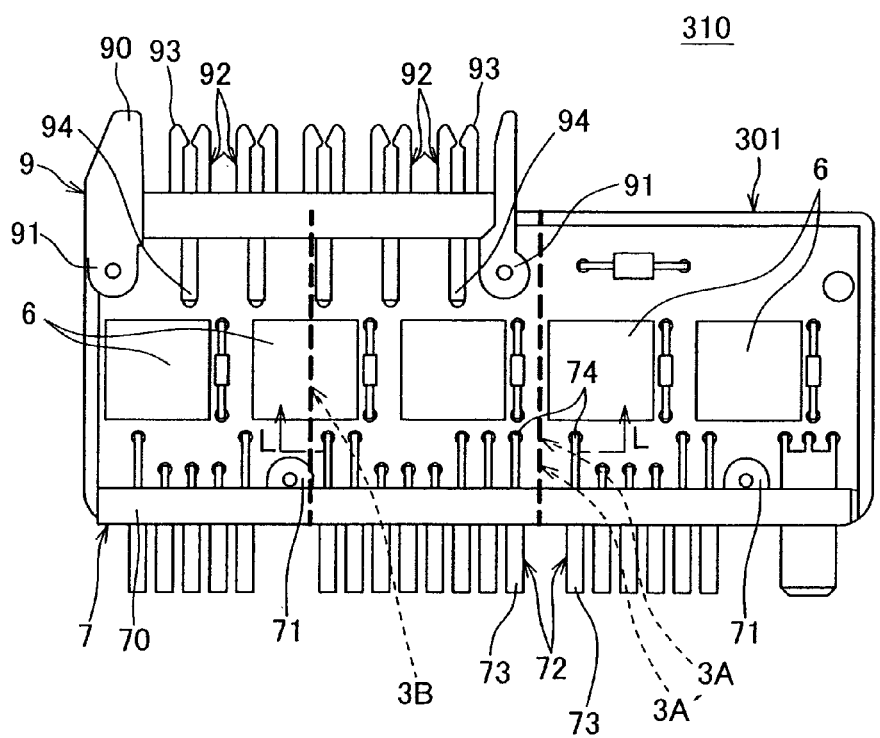
FIG. 15 is a plan view showing outline structures of a metal core board and an electric connection box of the fourth embodiment according to the present invention.

The electric connection box 310 according to the embodiment is mounted at a car and configured to distribute electric power from a plurality of power source systems including a battery and an alternator to a plurality of electronic apparatuses. The electric connection box 310 as shown in FIG. 15 includes a metal core board 301; a plurality of relays 6, a connector block 7 and a fuse block 9, which are mounted on a surface of the metal core board 301; and a not-shown case.

Figure 16:
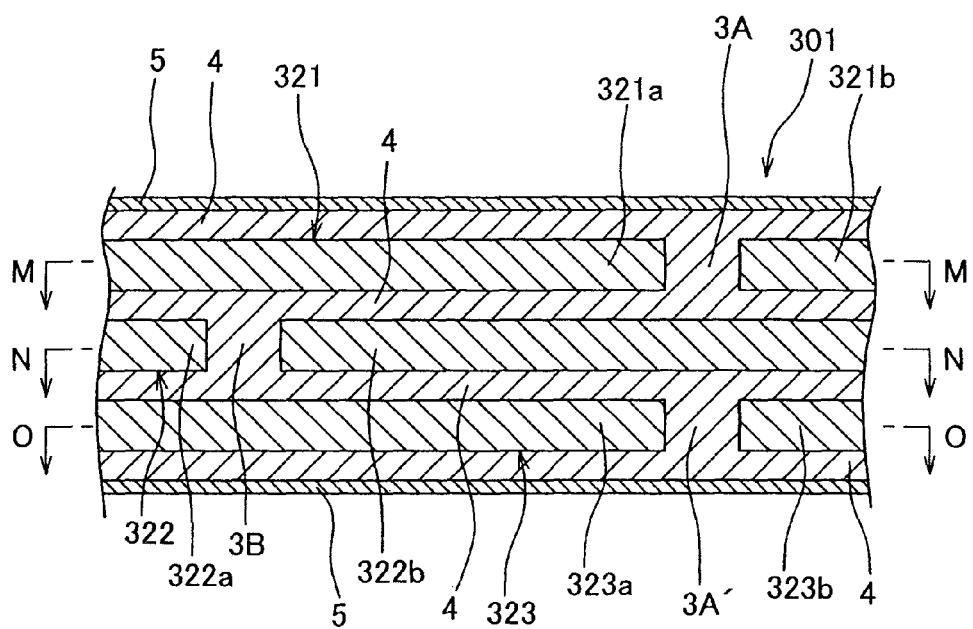
FIG. 16 is a cross-sectional view taken along line L-L shown in FIG. 15.

The metal core board 301 as shown in FIG. 16 is provided with three layered core metal plates 321, 322, 323 arranged at an interval to each other; four layered insulation layers 4 arranged between the core metal plates 321, 322, 323 and at a surface of the core metal plate 321 at a side far from the core metal plate 322, and at a surface of the core metal plate 323 at a side far from the core metal plate 322; a conductive print circuit layer 5 formed by copper foil arranged at a surface of the insulation layer which is non-contact with the core metal plates 321, 322; and a plurality of not-shown through holes. The metal core board 301 is formed into a rectangular shape.

Figure 17:
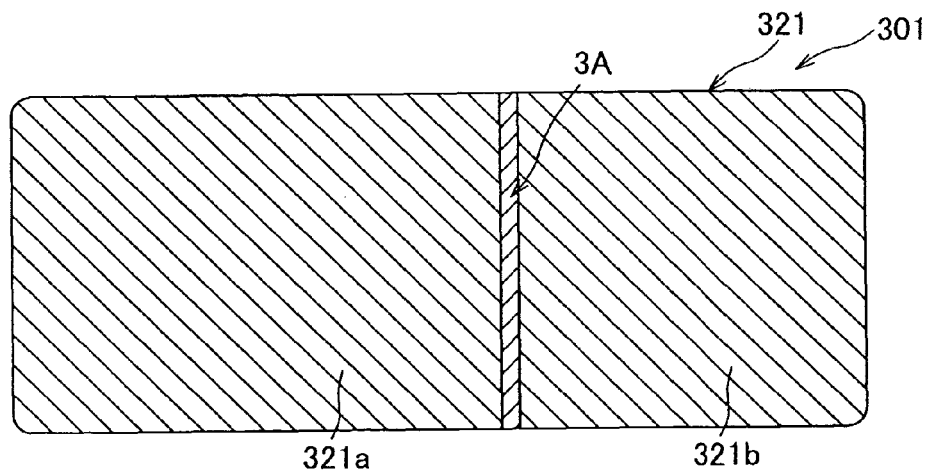
FIG. 17 is a cross-sectional view taken along line M-M shown in FIG. 16.
Figure 18:
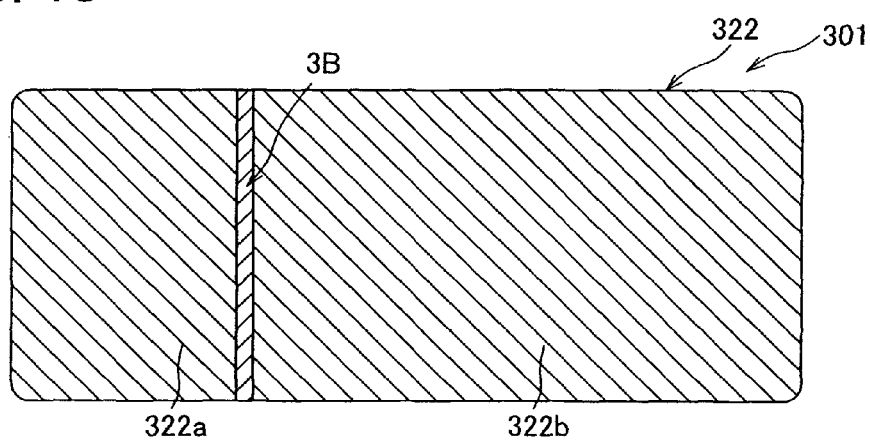
FIG. 18 is a cross-sectional view taken along line N-N shown in FIG. 16.
Figure 19:
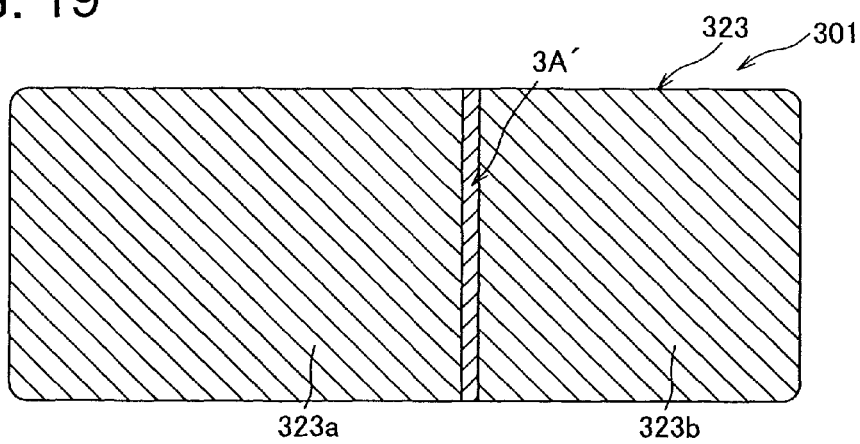
FIG. 19 is a cross-sectional view taken along line O-O shown in FIG. 16.

The core metal plate 321, 322 is formed with a rectangular copper plate or a rectangular metal plate including copper. At the core metal plates 321, 322, as shown in FIGS. 17-19, straight slits 3A, 3B, 3A' are formed so as to divide the core metal plates 321, 322, 323 to each two separated plates 321a, 321b and 322a, 322b and 323a, 323b. The slit 3A, 3B, 3A' is formed to have a width of 0.5-1.0 mm. Insulation material structuring the insulation layer 4 is filled in the slits 3A, 3B, 3A'. Thereby, the separated plate 321a and the separated plate 321b of the core metal plate 321 are insulated from each other and also formed integrally with the insulation material. Similarly, the separated plate 322a and the separated plate 322b of the core metal plate 322 are insulated from each other and also formed integrally with the insulation material. Similarly, the separated plate 323a and the separated plate 323b of the core metal plate 323 are insulated from each other and also formed integrally with the insulation material. In FIGS. 17-19, through holes are not shown.

Such electric connection box 310 distributes electric power inputted from the plurality of power source systems including the battery and the alternator to each separate plates 321a, 321b, 322a, 322b, 323a, 323b, toward each of the electronic apparatuses.

In the electric connection box 310 according to the present invention, for preventing that the metal core board 301 is bent along the slit 3A, 3B and 3A' by loading weights of the relay 6, the connector block 7 and the fuse block 9 and a weight of the metal core board 301 itself at the slits 3A, 3B and 3A' having strength weaker than the other portions, a reinforce structure described hereafter is applied.

As the reinforce structure according to the present invention, the slit, which is arranged so as to be on the same line when viewed in a direction vertical to the metal core board 301 as shown in FIGS. 15 and 16, is not formed at all of core metal plates 321, 322, 323. In other words, the slit 3A of the first layer core metal plate 321 is formed to overlaps the slit 3A' of the third layer core metal plate 323, and the slit 3B of the second layer core metal plate 322 is formed not to overlaps the slit 3A and 3A' on the same line.

According to the reinforce structure, the slits 3A and 3A' overlap a part of the core metal plate 322, at which the slit 3B is not formed, that is the separate plate 332b, and the slit 3B overlaps a part of the core metal plate 321, at which the slit 3A is not formed, that is the separate plate 321a, and a part of the core metal plate 323, at which the slit 3A' is not formed, that is the separate plate 323a. Thereby, a part having weaker strength by forming the slits 3A, 3B, 3A' can be reinforced.

According to the present invention, in case that the metal core board includes three layered core metal plates, the slits of the two core metal plates can be formed on the same line. In other words, meaning of that the slit, which is arranged so as to be on the same line when viewed in a direction vertical to the metal core board 301 is formed at all of core metal plates 321, 322, 323 corresponds to a case of that the slit 3B overlaps the slits 3A and 3A' on the same line.

According to the present invention, the metal core board 301, which can limit increase of size thereof and can prevent from bending along the slits 3A, 3B, 3A' and the electric connection box 310 including the metal core board 301 can be provided.

The fifth embodiment: the metal core board and the electric connection according to the second embodiment of the present invention will be described with reference to drawings FIGS. 20-24. The same components as the above-mentioned first embodiment are given the same mark and the description about it is omitted.

Figure 20:
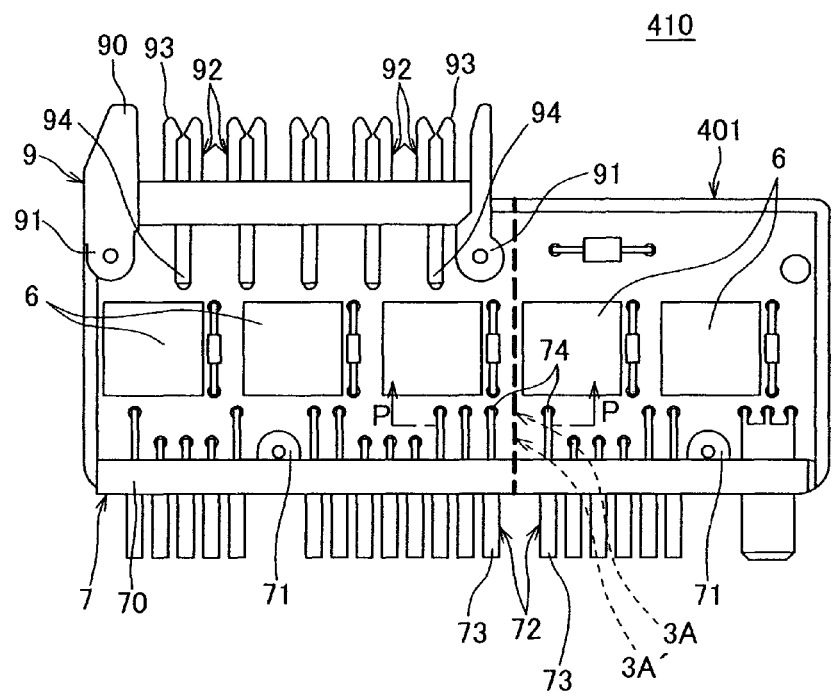
FIG. 20 is a plan view showing outline structures of a metal core board and an electric connection box of the fifth embodiment according to the present invention.

The electric connection box 410 according to the embodiment is mounted at a car and configured to distribute electric power from a plurality of power source systems including a battery and an alternator to a plurality of electronic apparatuses. The electric connection box 410 as shown in FIG. 20 includes a metal core board 401; a plurality of relays 6, a connector block 7 and a fuse block 9, which are mounted on a surface of the metal core board 401; and a not-shown case.

Figure 21:
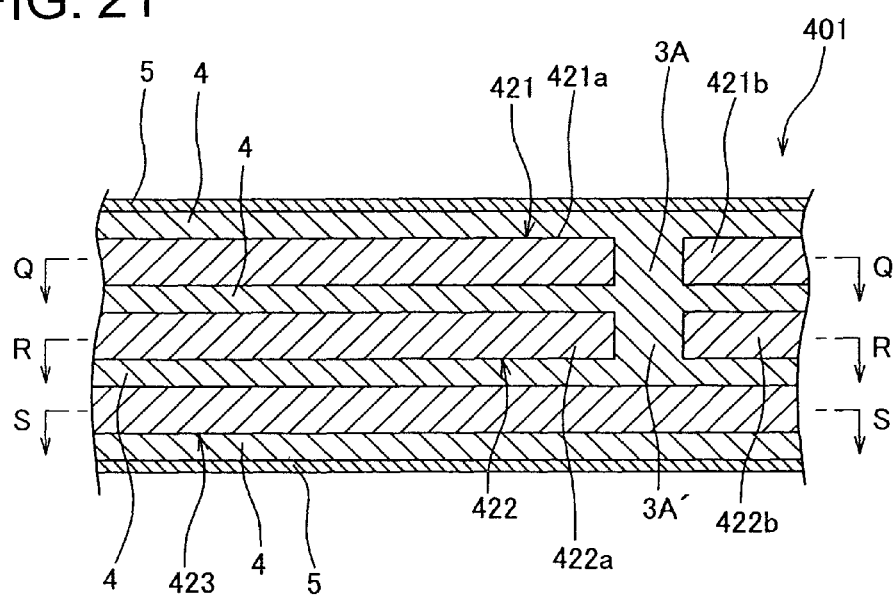
FIG. 21 is a cross-sectional view taken along line P-P shown in FIG. 20.

The metal core board 401 as shown in FIG. 21 is provided with three layered core metal plates 421, 422, 423 arranged at an interval to each other; four layered insulation layers 4 arranged between the core metal plates 421, 422, 423, and at a surface of the core metal plate 421 at a side far from the core metal plate 422, and at a surface of the core metal plate 423 at a side far from the core metal plate 422; a conductive print circuit layer 5 formed by copper foil arranged at a surface of the insulation layer which is non-contact with the core metal plates 421, 422, 423; and a plurality of not-shown through holes. The metal core board 401 is formed into a rectangular shape.

Figure 22:
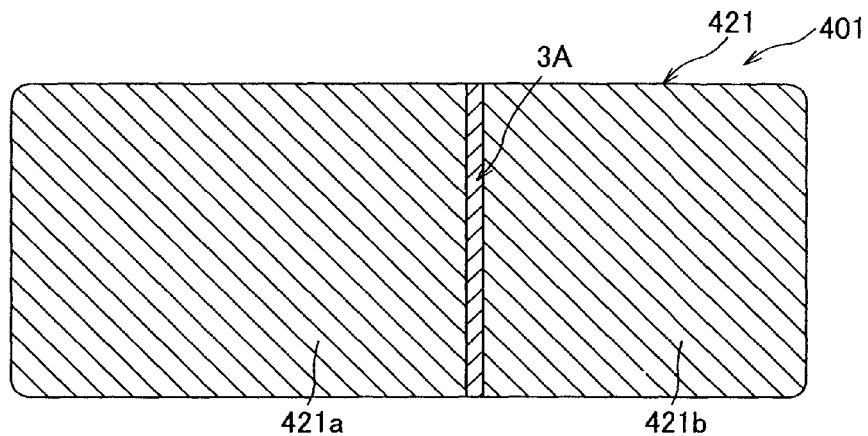
FIG. 22 is a cross-sectional view taken along line Q-Q shown in FIG. 21.
Figure 23:
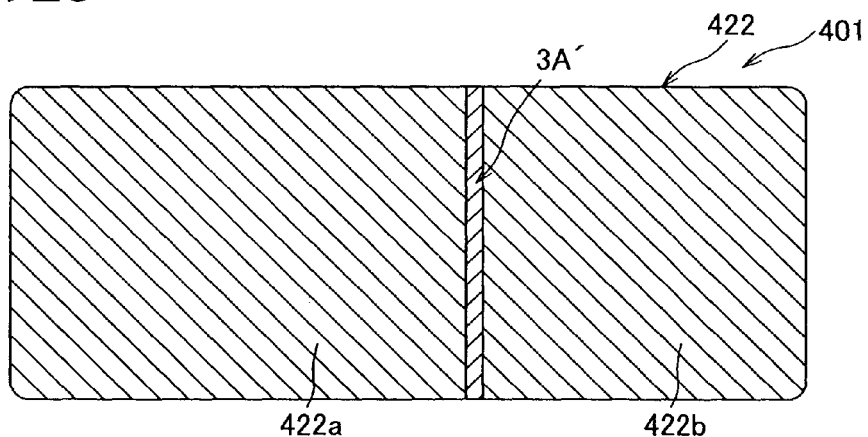
FIG. 23 is a cross-sectional view taken along line R-R shown in FIG. 21.
Figure 24:
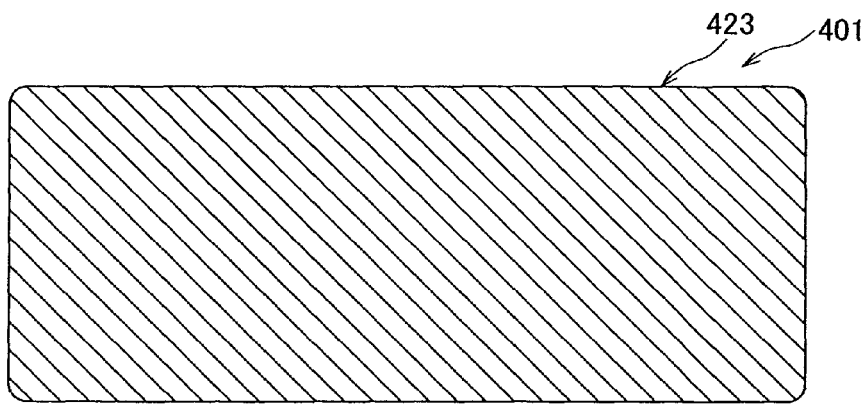
FIG. 24 is a cross-sectional view taken along line S-S shown in FIG. 21.
Figure 25:
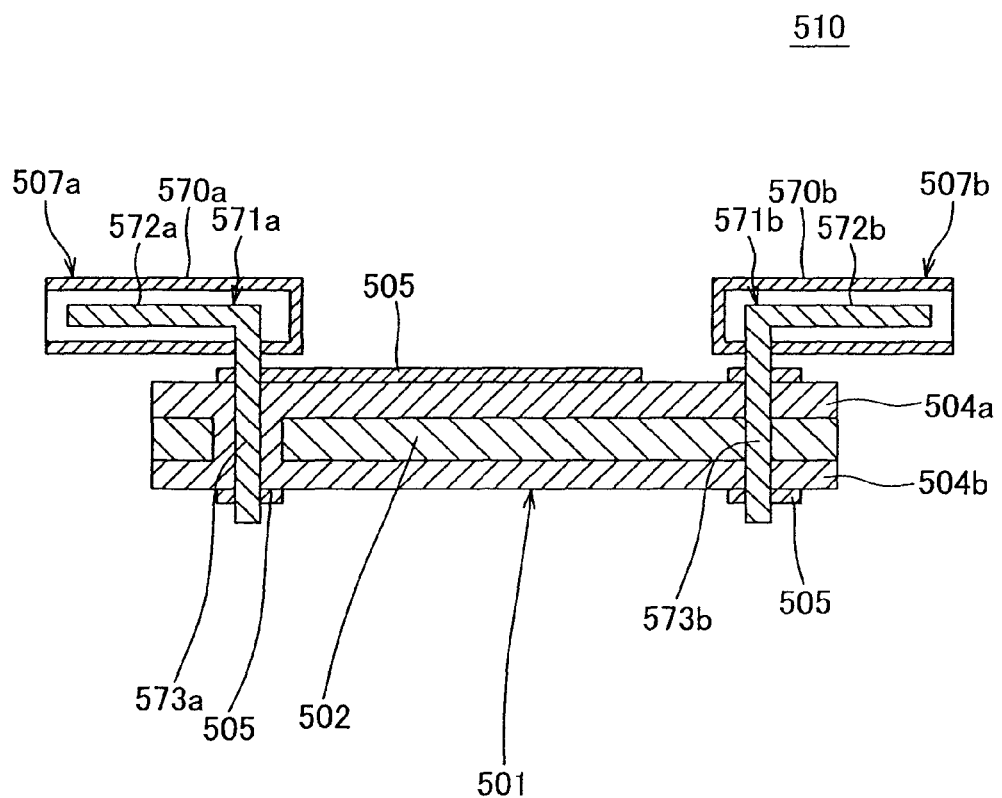
FIG. 25 is a cross-sectional view showing an outline structure of an electric connection box by prior art.
Figure 26:
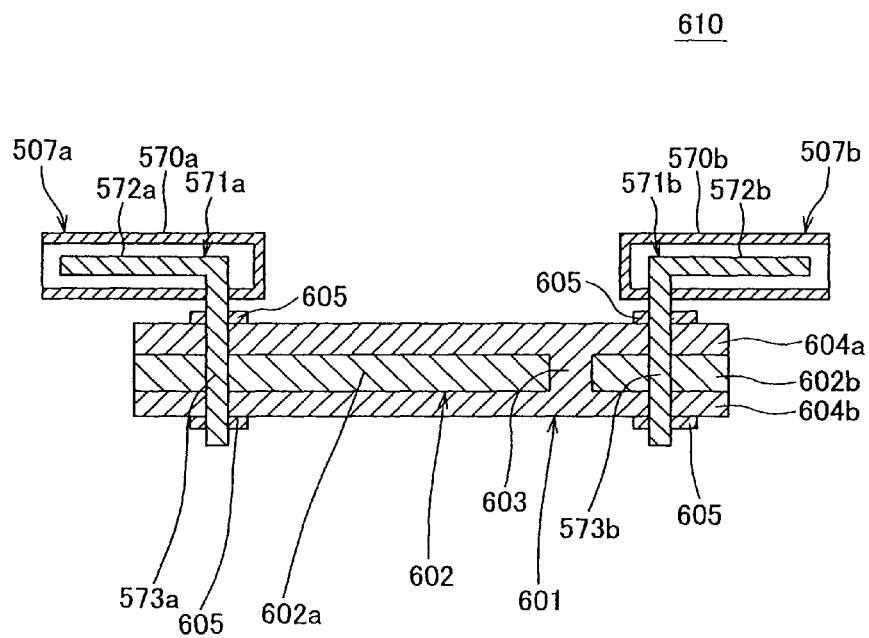
FIG. 26 is a cross-sectional view showing an outline structure of another electric connection box by prior art.
Figure 27:
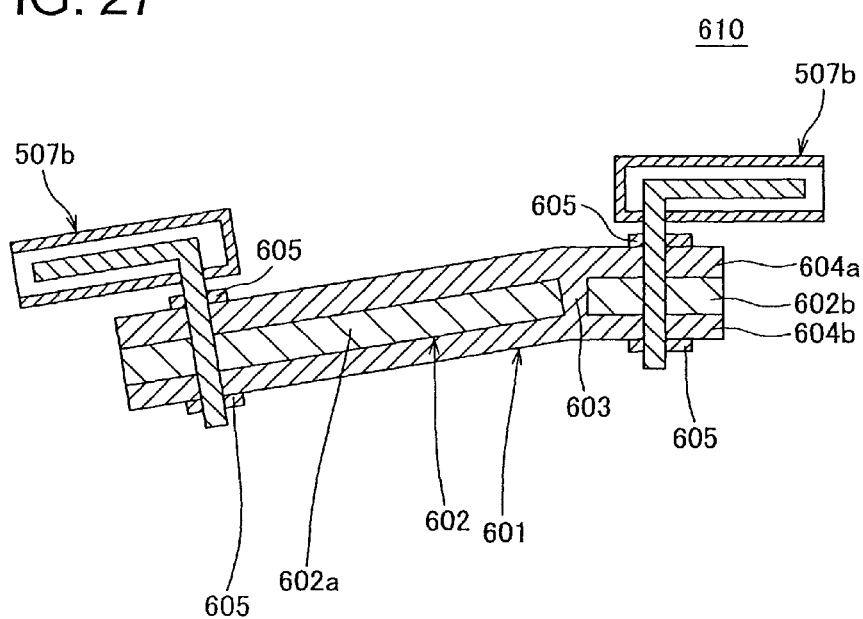
FIG. 27 is a cross-sectional view of the electric connection box shown in FIG. 26, which is bent.

The core metal plate 421, 422, 423 is formed with a rectangular copper plate or a rectangular metal plate including copper. At the core metal plates 421, 422, 423, as shown in FIGS. 22 and 23, straight slits 3A, 3A' are formed so as to divide the core metal plates 421, 422 to each two separated plates 421a, 421b and 422a, 422b. The slit 3A, 3A' is formed to have a width of 0.5-1.0 mm. Insulation material structuring the insulation layer 4 is filled in the slits 3A, 3A'. Thereby, the separated plate 421a and the separated plate 421b of the core metal plate 421 are insulated from each other and also formed integrally with the insulation material. Similarly, the separated plate 422a and the separated plate 422b of the core metal plate 422 are insulated from each other and also formed integrally with the insulation material. As shown in FIG. 24, no slit is formed at the core metal plate 423. In FIGS. 22-24, through holes are not shown.

Such electric connection box 410 distributes electric power inputted from the plurality of power source systems including the battery and the alternator to each separate plates 421a, 421b, 422a, 422b and the core metal plate 423 toward each of the electronic apparatuses.

In the electric connection box 410 according to the present invention, for preventing that the metal core board 401 is bent along the slit 3A and 3A' by loading weights of the relay 6, the connector block 7 and the fuse block 9 and a weight of the metal core board 401 itself at the slits 3A and 3A' having strength weaker than the other portions, a reinforce structure described hereafter are applied.

As the reinforce structure according to the present invention, the slit, which is arranged so as to be on the same line when viewed in a direction vertical to the metal core board 401 as shown in FIGS. 20 and 21, is not formed at all of core metal plates 421, 422, 423. In other words, the slit 3A of the first layer core metal plate 421 is formed to overlaps the slit 3A' of the second layer core metal plate 422, and no slit is formed at the third core metal plate 423, so that no slit overlapping the slit 3A and 3A' on the same line is formed.

According to the reinforce structure, the slits 3A and 3A' overlap the core metal plate 423, which no slit is arranged, so that parts, which have weaker strength by arranging the slits 3A and 3A', can be reinforced.

According to the present invention, when the core metal plate of the metal core board is structured by three layers, slits overlapping on the same line can be formed about two layers.

According to the present invention, the metal core board 401, which can limit increase of size thereof and can prevent from bending along the slits 3A, 3A', and the electric connection box 410 including the metal core board 401 can be provided.

According to the above-mentioned embodiment, all core metal plates and all separate plates are used for the electric power distributing circuit for distributing the electric power from the power source. According to the present invention, all core metal plates and all separate plates may not be used for the electric power distributing circuit for distributing the electric power from the power source. In other words, some of the plurality of core metal plates and some of the plurality of separate plates can be used only for heat dissipation.

The present inventions are described based in the embodiments as mentioned above, but the present invention is not limited in above embodiments. Various change and modifications can be made with the scope of the present invention.

REMARKS 1, 101, 201, 301, 401 Metal core board
3A, 3A', 3B, 3C, 3D, 3E Slit
10, 110, 210, 310, 410 Electric connection box
21, 22, 121, 122, 221, 222, 321, 322, 323, 421, 422, 423 Core metal plate
21a, 21b, 22a, 22b, 121a, 121b, 122a, 122b, 221a, 221b, 222a, 222b, 321a, 321b, 322a, 322b, 323a, 323b, 421a, 421b, 422a, 422b Separate plate

The invention claimed is:

1. A metal core board which is used for an electric connection box, comprising:
    a plurality of core metal plates to be laminated that are separated in a vertical direction;
    insulation resin filled between each of the plurality of core metal plates; and
    a slit formed in at least one of the plurality of core metal plates so as to divide the core metal plate to a plurality of separate plates and being filled with the insulation resin therebetween, wherein the slit is disposed to entirely overlap, at a corresponding lateral position, a region of another vertically separated core metal plate that defines a contiguous sheet of metal so that each contiguous sheet of metal at the corresponding lateral position overlaps at least one slit, and wherein the slit is not formed in at least one of the plurality of core metal plates, thereby a part of the core metal plate having a weak strength due to formation of the slit is reinforced.

2. An electric connection box, comprising the metal core board according to claim 1 for distributing electric power inputted from a plurality of power source systems respectively to each of the core metal plates and each of the separate plates.

3. An electric connection box, comprising the metal core board according to claim 1, for distributing electric power inputted form a plurality of power source systems respectively to each of the core metal plates and each of the separate plates.

4. The metal core board according to claim 1, wherein upper and lower surfaces of each of the plurality of core metal plates are laminated by the insulation resin.

5. The metal core board according to claim 1, wherein the slit formed in the at least one of the plurality of core metal plates is laterally separated from another slit formed in another of the plurality of core metal plates.

6. The metal core board according to claim 5, wherein a lateral distance separating the slit and the other slit exceeds a width of either of the slits.

7. The metal core board according to claim 1, wherein the core metal plates located adjacent to each other in the vertical direction are adhered to each other via only the insulation resin.

* * * * *